THERMOELECTRIC ELEMENTS UTILIZING DISTRIBUTED PELTIER EFFECT

Filed Oct. 13, 1966 2 Sheets-Sheet 1

Inventors:
Allen D. Reich
Marland L. Stanley
and Kenneth J. Kountz
By: Thomas B. Hunter Atty.

THERMOELECTRIC ELEMENTS UTILIZING DISTRIBUTED PELTIER EFFECT

Filed Oct. 13, 1966 2 Sheets-Sheet 2

United States Patent Office 3,564,860

Patented Feb. 23, 1971

3,564,860

THERMOELECTRIC ELEMENTS UTILIZING DISTRIBUTED PELTIER EFFECT

Allen D. Reich, Des Plaines, Marland L. Stanley, Lombard, and Kenneth J. Kountz, Roselle, Ill., assignors to Borg-Warner Corporation, Chicago, Ill., a corporation of Illinois Filed Oct. 13, 1966, Ser. No. 586,486

Int. Cl. H01v *1/32*

U.S. Cl. 62—3 5 Claims

ABSTRACT OF THE DISCLOSURE

A thermoelectric couple for use in a Peltier cooling device includes P-type and N-type thermoelectric elements in which at least one of said thermoelectric elements is formed of a material having varying thermoelectric properties. The Seebeck coefficient (absolute value) of the material adjacent the cold junction is significantly less than the Seebeck coefficient (absolute value) of material adjacent the hot junction. The variance in such properties may be a continuous gradient, or the thermoelectric elements may be made up of discrete segments of different materials bonded together.

BACKGROUND AND SUMMARY OF THE INVENTION

This invention relates generally to thermoelectric devices and more particularly to improvements in Peltier cooling elements.

A conventional thermoelectric couple comprises a P-type semiconductor element (sometimes referred to as an arm or billet) doped with acceptor impurities, and an N-type semiconductor element doped with donor impurities. Both the P-type and the N-type elements are joined in series by a conductor, usually in the form of a copper bus bar. As unidirectional electrical energy is caused to flow through the elements, a temperature differential is produced across the opposite ends of the elements. This phenomenon, known as the Peltier effect, makes such thermoelectric devices useful in refrigeration applications, particularly where trouble-free and quite operation is required.

The quality of thermoelectric elements is commonly measured by a somewhat arbitrary value called the Figure of Merit or "Z." This value is calculated according to:

$$Z=\frac{S^2\sigma}{K}$$

where $\sigma$ is the specific electrical conductivity;
K is the coeffcient of thermal conductivity; and
S is the Seebeck, or thermoelectric power, coefficient.

Each of the above parameters is an intrinsic physical characteristic of the material itself and can be varied within fairly wide limits by using different materials and manufacturing techniques. Also, each of the parameters is function of temperature and therefore meaningful only when defined for a particular temperature. More specifically, the parameters used in calculated the Figure of Merit Z are usually dependent on the temperature in the following relationship:

(1) S—increases as temperature increases;
(2) $\sigma$—decreases as temperature increase; and
(3) K—decreases as temperature increases.

The parameters S, $\sigma$ and K for most thermoelectric materials are related in such a way that the highest values of Z are obtained when $\sigma$ is between 800 and 1200 (ohm-cm.)$^{-1}$. If $\sigma$ is plotted against values of Z, Z increases as the values of $\sigma$ increase up to a predetermined point within the range of 800 to 1200 (ohm-cm.)$^{-1}$; and then Z begins to drop off. It is also true that low $\sigma$ materials, e.g., 300–400 (ohm-cm.)$^{-1}$ have relatively high S-values and that high $\sigma$ materials, e.g., over 1500 (ohm-cm.)$^{-1}$, have relatively low S-values.

The Seebeck coefficient is the most important characteristic of any thermoelectric material; and conventional devices gain most of their performance by virtue of the Seebeck coefficient changing abruptly at the conductor/thermoelectric material interface. It is this sharp discontinuity that results in the Peltier cooling effect.

In addition, a relatively smaller contribution to the cooling phenomenon results from the so-called Thomson effect which is due to the temperature dependence of the Seebeck coefficient. When a thermoelectric couple is energized, it produces a temperature gradient between the cold junction at one end and the hot junction at the other. Since S varies with temperature, a homogeneous thermoelectric element will be characterized by an S variation along the length of the element which corresponds to the temperature gradient. This S variation produces either heating or cooling in the volume of material.

The present invention assumes that all of these effects are operative in the device and introduces additional cooling capacity by means of non-homogeneous thermoelectric elements such that the Seebeck coefficient, measured at the same temperature, varies explicitly along the spatial extent of said element. In other words, neglecting the temperature dependence of S for analysis, the S values of the material, corrected to the same temperature, vary from one end of the thermoelectric element to the other. Accordingly, the device has an improved performance which results from the fact that the explicit S variation, normally present exclusively at the cold junction, is distributed along the length of the element.

Introducing a Seebeck coefficient which varies as a function of the position along the length of the element places the distributed Peltier effect under the manufacturer's control in a way which is not possible with the Thomson effect.

Since the Figure of Merit must be calculated either at some typical or representative temperature, the resulting average Z gives a first order measurement of the material quality. While average Z continues to measure the quality in the distributed effect devices of the present invention, it is no longer the absolute measure of material quality.

The effect of the temperature dependence of S can be analyzed by a parameter called the Thomson coefficient which is defined by:

$$\tau=T\frac{dS}{dT}$$

where T is the absolute temperature and $dS/dT$ is the rate of change of the Seebeck coefficient with respect to changes in temperature. When the S dependence on position is present, i.e., S(X), a parameter $\mu^*$ can be defined as:

$$\mu^*=T\frac{dS}{dX}$$

where T=absolute temperature
$dS/dX$=rate of change of S with respect to position.

The improved performance of the thermoelectric couples constructed in accordance with the present invention can best be understood by introducing an integrated parameter which represents the total variation of S from the cold junction, $T_C$, to the hot junction, $T_H$, or from X=O (which corresponds to $T_C$) to X=L (which corresponds to $T_H$). In this case, the quality can be measured by $\mu$ calculated according to:

$$\mu=\frac{S(L)-S(O)}{\bar{S}}=\frac{\Delta S}{\bar{S}}$$

Division of the total S variation, ΔS, by the average S, denoted as S, provides a dimensionless parameter which is more convenient for analysis and comparison.

An important aspect of the present invention is the recognition that the explicit positional effect should be taken into consideration to improve the performance of thermoelectric devices. Furthermore, a measurement can be carried out which will distinguish experimentally the positional effect from the conventional Peltier and Thomson effects. In a device in which the Peltier and Thomson effects are considered alone, the device can be operated with either end of the thermoelectric element as the cold junction (by reversing the current direction), and the overall cooling performance will be the same. In other words, these effects are symmetric with respect to thermoelectric reversal. On the other hand, when an explicit S variation is present, performance will be augmented in one direction and diminished in another.

In actual practice, the positional effect can be introduced either as a continuous variation of S or by a discrete or segmented distribution. The continuous distribution would normally involve variations in the composition, growth kinetics, or impurity concentration during the manufacture of the thermoelectric material. The discrete approach can be accomplished by selecting various samples of different rods of thermoelectric material, or by using sections of rods such that the resulting assembled thermoeletcric arm is made up of a series of discrete elements, all of which have different characteristics, particularly values of S.

The first method, i.e., that of producing continuous distribution in a thermoelectric element, avoids extra junctions between the hot and cold junction and thereby should reduce miscellaneous losses due to such junctions. On the other hand, this method may require special modifications of the manufacturing technology currently available in the state of the art.

The second method permits unrestricted choice of various combinations of material from a stockpile; but it is characterized by contact losses because of the extra junctions. Various results covering both approaches are described herein; but the experimental results are limited to the segmented type of element.

Based on theoretical considerations, both the continuous and plural segment devices will improve overall performance of the device. For practical purposes, the new parameter which characterizes the improvement is $\Delta S/\overline{S}$. The $\Delta T_{max}$ (viz, effective Z at no load) increases in approximately linear fashion with increases in $\Delta S/\overline{S}$ at constant Z, and to a lesser extent, is dependent on the functional form of S. The engineering performance, particularly heat pumping capacity and COP, also shows improvements which are related to the parameter $\Delta S/\overline{S}$. Compared to a conventional couple, with substantially the same Z and the amount of material, the devices described herein show a much greater improvement at large ΔT's at all operating points and at small ΔT's when the applied current is near its maximum value ($I_{max}$), i.e., that value of the current which produces the maximum ΔT.

It should be pointed out at this juncture that segmented thermoelectric couples are known in the prior art, particularly in the fabrication of Seebeck power generators, i.e., those which convert thermal energy into electrical energy as contrasted with Peltier devices which convert electrical energy into a heat pumping effect. Seebeck generators, which operate over very large ΔT's, have been designed so that the material used for each segment operates in the range of its optimum Figure of Merit (Z). In other words, since materials can be made such that their optimum Figures of Merit are obtained within particular temperature ranges, a device operating over a wide temperature range (several hundred degrees F.) can be constructed so that each segment reaches its maximum Z value within the operating temperature range to which it is subjected. An example of such segmented generators is described in U.S. Pat. 3,051,767.

The present invention provides a non-homogeneous Peltier device which operates on an entirely different set of principles from the segmented thermoelectric generator discussed above. In a Peltier device designed for refrigeration applications, the temperature differential between the hot and cold junctions is relatively small. For example, the hot junction may be close to room temperature (300° K.) and the cold junction may be at approximately 210° K. Consequently, the temperature dependence of S, K, and $\sigma$ is not as important as the temperature dependence of these parameters in a thermoelectric generator where the temperature differential imposed on each couple may be several hundred degrees Kelvin.

Accordingly, the present invention has as a principal object to improve the cooling capability of thermoelectric devices by introducing a variable Seeback coefficient along the spatial extent of the thermoelectric element.

Another object of the invention is to utilize positional variation for enhancing single stage Peltier cooling performance.

Still another object of the invention is to provide an improved thermoelectric cascade system in which the parameters for the thermoelectric elements are varied in accordance with a predetermined formula.

Another object of the invention is to provide a system in which the maximum temperature differential between the hot and cold junctions is increased.

Another object of the invention is to improve the heat pumping performance of a Peltier cooling element.

Still another object of the invention is to provide a system in which the average Z and total S variation may be adjusted to obtain a maximum ΔT and maximum heat pumping, with only a small sacrifice in the coefficient of performance (COP), by utilizing a high average coefficient of thermal conductivity.

Still another object of the invention is to provide a method of adjusting average Z and total S to obtain a higher coefficient of performance.

Additional objects and advantages will be apparent from the following detailed description taken in conjunction with the drawings.

DESCRIPTION OF THE DRAWING

FIG. 6 is a graph showing the performance curve of a segmented thermoelectric couple;

FIG. 7 is a graph showing a comparison between the heat pumping performance of a segmented thermoelectric couple and a conventional thermoelectric couple;

FIG. 8 is a graph similar to FIG. 7 showing the performance of a segmented thermoelectric couple which is designed for high average Z and a conventional thermoelectric couple; and FIG. 9 is a graph showing the relationship between the number of stages and the system COP for a cascaded system.

DETAILED DESCRIPTION OF THE INVENTION

Figure 1:
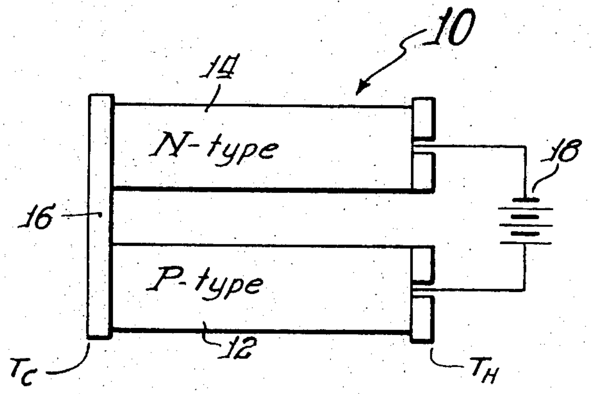
Fig. 1 PRIOR ART
FIG. 1 is a schematic illustration of a conventional prior art thermoelectric couple having P and N thermoelectric elements.

In order to provide a background for the more detailed description which follows, a typical prior art thermoelectric couple is illustrated in FIG. 1. This couple, designated generally at 10, comprises a homogeneous element 12 of P-type semiconductor material (doped with acceptor impurities) and a second homogeneous element 14 of N-type semiconductor material (doped with donor impurities). The two elements 12 and 14 are coupled in series by a conductor 16, usually in the form of a copper bus bar which is soldered or otherwise electrically and physically joined to the ends of the thermoelectric elements.

The application of unidirectional electrical energy through the P and N elements in series produces a cold junction $T_c$ at one end of each of said elements and a hot junction $T_h$ at the opposite ends. The supply of electrical energy, while shown schematically as being in the form of a D.-C. battery 18, is more frequently rectified and filtered A.-C. The temperature gradient across the couple from the hot junction to the cold junction is conventionally referred to as the $\Delta T$.

Figure 2:
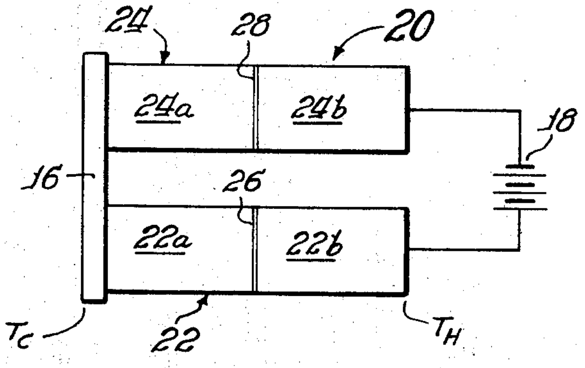
FIG. 2 is a segmented thermoelectric element in which different materials are bonded together to provide the respective P and N arms.

Referring now to FIG. 2, the improved thermoelectric couple 20 of the present invention is similar to the couple described above in connection with FIG. 1, except that the P-element 22 is made up of two (or more) discrete segments 22*a*, 22*b* and the N-element 24 is made up of two (or more) segments 24*a*, 24*b*. The adjacent segments constituting each element are joined to each other by soldering or other suitable means and form contact areas at 26, 28, respectively. Each segment is formed of a thermoelectric material which has different physical properties so that the elements may be considered as being nonhomogeneous. For convenience, the properties S, $\sigma$ and K for each segment will be designated by subscripts indicating the type (P or N) and the position relative to the cold junction (1, 2 . . . *n*). For example, the Seebeck coefficient of segment 22*a* will be designated as $S_{P,1}$.

For reasons which will become apparent from a more detailed discussion of the properties of segmented thermoelectric generators, the specific relationship between the varying properties of the improved thermoelectric elements is a fundamental aspect of this invention. For any thermoelectric couple made in accordance with this invention, the S variation from the cold junction (location denoted as 1) to the hot junction (location denoted as *n* is related as follows:

$$S_{P,1}<S_{P,2}<S_{P,n}$$

$$|S_{N,1}|<|S_{N,2}|<|S_{N,n}|$$

The specification will now set forth specific examples of thermoelectric elements in which the values for S, $\sigma$, K, Z and $\lambda$ (the ratio of the length to the cross-sectional area in each segmented element) were measured (or calculated) in actual devices.

EXAMPLE I

A two-segment, P-type arm having an overall length of about 0.340 in. and segments of 0.170 in., each, was fabricated with materials having the properties defined in the following table:

| | Segment No. 1 | Segment No. 2 |
|---|---|---|
| Parameter: | | |
| S (μvolt./deg.) | 168 | 277 |
| σ (ohm c.)$^{-1}$ | 1,609 | 405 |
| K (M watts/cm. deg. C | 17.8 | 12.8 |
| Z | 2.55 | 2.42 |
| λ | 1.39 | 1.39 |

EXAMPLE II

A 3-segment P-type arm was fabricated from quarter inch cylindrical material. Each segment had a length of about 0.120 in. to give an overall length of 0.360 inch. The materials for this arm were selected in accordance with the following table:

| | P arm segment | | |
|---|---|---|---|
| Parameter: | | | |
| S (μvolt/deg.) | 179.5 | 227 | 273 |
| σ (ohm cm.)$^{-1}$ | 1525 | 716 | 382 |
| K M watts/cm. deg. C | 14.9 | 11.9 | 10.6 |
| Z | 3.09 | 3.10 | 2.70 |
| λ | 1.305 | 0.833 | 0.864 |
| $\bar{Z}$ | | 3.02 | |
| $\Delta S/\bar{S}$ | | .420 | |

EXAMPLE III

A two-segment N-type arm was constructed from one piece of commercial quality bismuth telluride material and a second piece of bismuth-antimony material. Compared to the P-type arm of Example II, this arm has a much lower Z and a higher $\Delta S$. The materials used in the N-type arm were selected in accordance with the following table:

| | N arm segments | |
|---|---|---|
| | No. 2 | No. 1 |
| Parameter: | | |
| S (μ volt/deg.) | −209 | −97.2 |
| σ (ohm cm.)$^{-1}$ | 1066 | 5420 |
| K M watts/cm. deg. C | 15.5 | 38.7 |
| Z | 1.50 | 3.01 |
| λ | 4.070 | 1.675 |
| $\bar{Z}$ | 2.25 | |
| $\Delta S/\bar{S}$ | .732 | |

Figure 3:
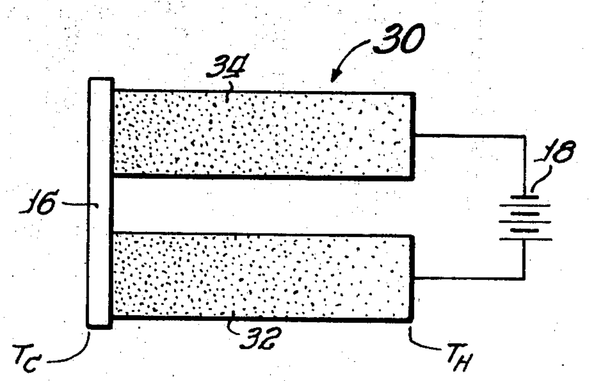
FIG. 3 is a thermoelectric couple in which the S variation is incorporated into the system by means of a continuous gradient.

FIG. 3 illustrates a thermoelectric couple in which the explicit S variation is introduced as a continuous gradient. The properties of the material adjacent the cold junction, $T_C$, in both the P element 32 and the N element 34 differ from the properties adjacent the hot junction $T_H$; and this variation is continuous rather than discrete. Such nonhomogeneous thermoelectric materials may be formed by selective doping, varying the rate of zone melting, and other known methods.

Figure 4:
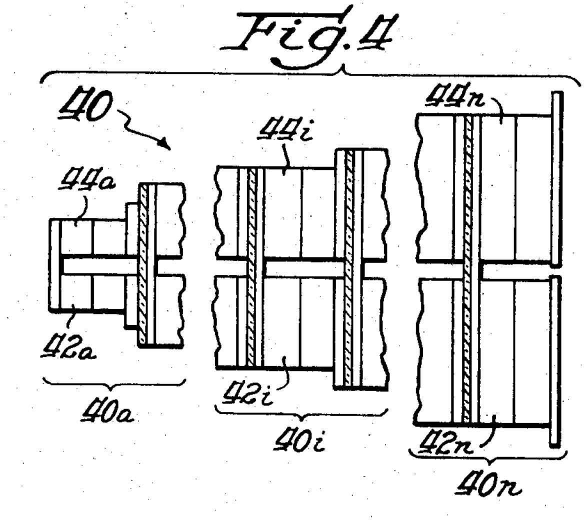
FIG. 4 is a schematic representation of a cascaded system constructed in accordance with the principles of the present invention.

FIG. 4 shows the application of the novel concepts of this invention to a cascade thermoelectric system. A cascade system is often used to achieve very high $\Delta T$'s by employing the cold junction of one stage as the heat sink for an adjacent hot junction. The cascade system, generally designated at 40, comprises *n* stages indicated at 40*a*, 40*i* and 40*n*, it being understood that the actual number of stages is dependent on the particular application and the design limitations of the system. Cascade theory, with particular emphasis on optimum design, is discussed more fully in U.S. Pat. 3,125,860, issued to A. D. Reich et al. on Mar. 24, 1964. It will be noted that each of the P elements 42*a*, 42*i*, 42*n* and each of the N elements 44*a*, 44*i*, 44*n* is segmented; but it should be understood that such elements can also be formed with a continuous S gradient in the manner shown in FIG. 3. The performance of cascade systems using nonhomogeneous thermoelements will be discussed below.

As discussed above, the independent effect of the explicit S variation may be measured by testing a nonhomogeneous device in one position and then repeating all measurements with the device in a reversed position. Since the Thomson effect is independent of position, any improvement or deterioration in device performance must necessarily be due to the positional effect. In order to study the positional effect in thermoelectric couples, both the P and the N arm should have identical properties. Since this can seldom be achieved in practice even with a conventional couple, it becomes more difficult in segmented devices where the number of different materials is just that many more. To avoid the confusion associated with two arms with different properties, the $\Delta T_{max}$ measurements were made on a single arm. To obtain valid measurements, the loading effect of the lead connected to the cold junction was removed by a precooling technique.

This technique has the additional advantage that devices can be tested without requiring both N and P materials of the desired properties.

Figure 5:
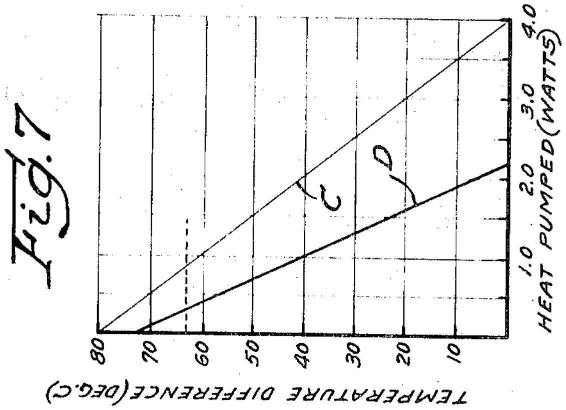
FIG. 5 is a graph showing the relationship between $\Delta T_{max}$ and the applied current for a segmented P-type arm in both its normal and reversed positions.
Figure 5:
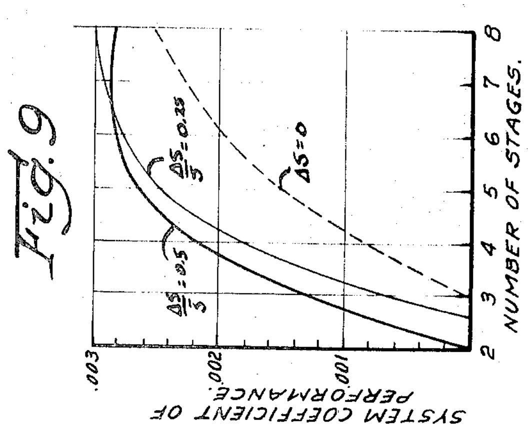
Figure 5:
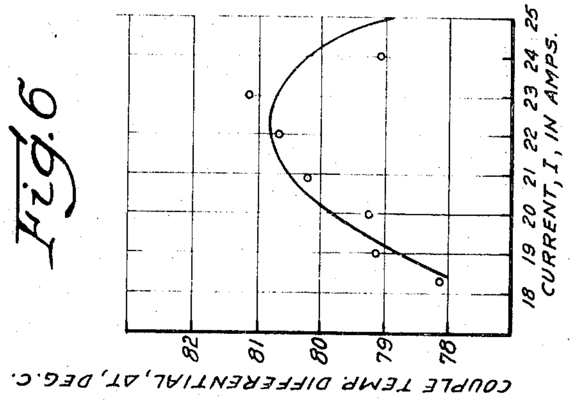
Figure 5:
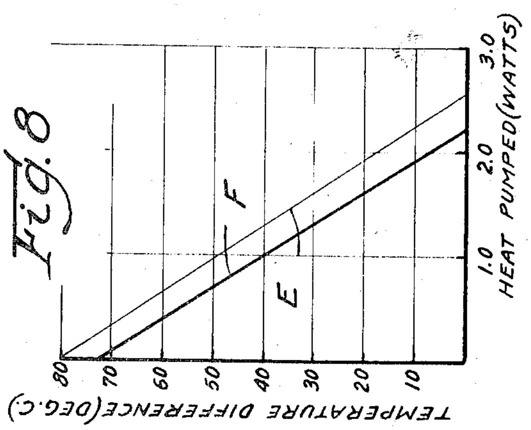
Figure 5:
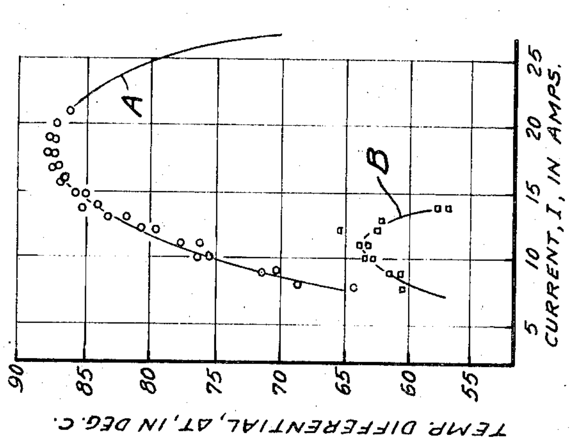

FIG. 5 shows the $\Delta T_{max}$ measurements for the two segment P-arm of Example I in both its normal and its reversed positions. The upper curve, designated at A, represents the $\Delta T$ measurement at various applied currents with the thermoelement in the position characterized by the table in Example I, i.e., with the $S=168\mu$ volt/deg. C. material at the cold junction. The lower curve B shows the $\Delta T$ measurements with the thermoelement in its reversed position; and the difference in performance can be directly attributed to the positional effect.

FIG. 6 represents the performance curve resulting from a plot of the $\Delta T$ against the applied current for a thermoelectric couple constructed from the 3 segment P-type arm of Example II and the 2 segment N-type arm of Example III. Compared to the best presently available commercial couple, the $\Delta T$ improvement at zero loads is about 7.5°–8.0° C. Under loaded conditions, the superiority of the heat pumping performance is also indicated. The COP is also substantially improved at larger $\Delta T$ values, with the crossing point between 62.5° and 65° C. At this temperature, with equal amounts of material, segmenting gives the same COP and pumps more than three times as much heat.

The improved heat pumping performance can best be understood by referring to FIG. 7 in which the heat pumped (in watts) is plotted against the temperature difference across the couple. The basis for comparison is the device referred to above (i.e., the 3-segment P-type element of Example II and the 2-segment N-type element of Example III) and a conventional homogeneous thermoelectric couple with a $\lambda$ of 1.65. The performance curve of the improved thermoelectric couple ($\lambda$ adjusted to 1.65) is shown in curve C while the loading curve of the homogeneous couple is shown in curve D. The ratio of the heat pumped by the improved couple to the heat pumped by a conventional couple ($Q_1/Q_S$) is set forth in the following table at various T values together with the COP for each couple at the stated values of $\Delta T$.

| | COP | | |
|---|---|---|---|
| $\Delta T$ | 1 | S | $Q_1/Q_S$ |
| 72.5 | .029 | 0 | |
| 70.0 | .040 | .019 | 7.14 |
| 67.5 | .050 | .031 | 4.13 |
| 65.0 | .060 | .056 | 3.57 |
| 62.5 | .071 | .080 | 2.97 |
| 60.0 | .080 | .107 | 2.50 |
| 55.0 | .100 | .139 | 2.40 |
| 50.0 | .120 | .179 | 2.24 |
| 40.0 | .160 | .261 | 2.04 |
| 30.0 | .200 | .339 | 1.97 |

In order to provide a segmented thermoelectric couple with high average Z, it may be necessary to select the materials so as to have a smaller value for $\Delta S/\bar{S}$. A high average Z thermoelectric couple was constructed in accordance with the following example:

EXAMPLE IV

A thermoelectric couple was fabricated using a 3-segment N-type arm and a 3-segment P-type arm with the parameters for the various segments as follows:

| | N Arm segments | | | P arm segments | | |
|---|---|---|---|---|---|---|
| | No. 3 | No. 2 | No. 1 | No. 1 | No. 2 | No. 3 |
| Parameter: | | | | | | |
| S | −259 | −204 | −152 | 172 | 202 | 265 |
| $\sigma$ | 587 | 1,105 | 1,821 | 1,555 | 984 | 479 |
| K | 15.2 | 16.4 | 20.0 | 17.45 | 14.05 | 12.32 |
| Z | 2.58 | 2.80 | 2.12 | 2.69 | 2.87 | 2.75 |
| $\bar{Z}$ | | 2.50 | | | 2.75 | |
| $\Delta S/\bar{S}$ | | .521 | | | .437 | |

FIG. 8 is a heat pumping curve for the thermoelectric couple constructed in accordance with Example IV. It will be noted that while the device has approximately the same $\Delta T_{max}$ as the device measured in FIG. 7, the loading curve E falls much faster and is in fact about parallel to the loading curve F for the conventional, homogeneous device. The COP data, on the other hand, has a marked improvement over the device tested in accordance with FIG. 7. Comparing the performance of the device of Example IV with that of the homogeneous sample, the COP values show about a 40 percent improvement over the entire operating range. This design trades off some pumping capacity to improve the COP while still maintaining $\Delta T_{max}$ at approximately the same values. This trade-off is accomplished by using different combinations of $\bar{Z}$ and $\Delta S/\bar{S}$; and it does not arise by any changes in the geometry or operating parameters. The following table corresponds to FIG. 8 showing the ratio of heat pumped by the device of Example IV to the heat pumped by the sample device ($Q_2/Q_S$) and the COP values at various values of $\Delta T$.

| | COP | | |
|---|---|---|---|
| $\Delta T$ | 2 | S | $Q_2/Q_S$ |
| 72.5 | .053 | .029 | ------- |
| 70.0 | .069 | .040 | 7.80 |
| 67.5 | .080 | .050 | 2.57 |
| 65.0 | .097 | .060 | 2.44 |
| 62.5 | .108 | .071 | 2.03 |
| 60.0 | .124 | .080 | 1.75 |
| 57.5 | .140 | .092 | 1.66 |
| 55.0 | .152 | .100 | 1.56 |
| 52.5 | .163 | .112 | 1.54 |
| 50 | .176 | .120 | 1.43 |
| 40 | .233 | .160 | 1.32 |
| 30 | .292 | .200 | 1.27 |
| 20 | .345 | .240 | 1.22 |

It was earlier stated that segmented or other non-homogeneous thermoelements can be employed to improve the characteristics of cascaded thermoelectric devices. This improvement in performance by introducing the $\Delta S/\bar{S}$ parameter very definitely extends to cascade configurations; and the advantages can be expected to be maximized with a cascade system using a minimum number of stages, thereby resulting in a $\Delta T$ that is nearer to $\Delta T_{max}$ for each stage. In this condition of operation, segmented elements offer great improvements in $\Delta T$, COP and heat pumping performance.

Cascade theory, as with single stage theory, can adopt a $\Delta T$ or a COP description of the system. The present demonstration utilizes the COP equation for the cascade given by:

$$\eta_T = \frac{1}{\prod_{a=1}^{N}\left(1+\frac{1}{\eta_a}\right)-1}$$

where $\eta_a$ is the efficiency of the $a$th stage, $\eta_T$ is the efficiency of the system, and the $\pi$ indicates that a product of all of the $(1+1/\eta_a)$ terms is to be taken.

The system COP, $\eta_T$, can be optimized by a two step process. First, the currents in each stage can be adjusted so that each stage operates at its own maximum efficiency. Secondly, the temperatures of the hot and cold junctions can be varied until the highest system COP is achieved. This design step can be facilitated by using the optimum temperature distribution which is given by:

$$T_c(2) = \frac{T_h}{1+\frac{\Delta T_T}{T_c}\frac{a}{N}}$$

where $\Delta T_T$, $T_c$ and $T_h$ are the system temperature differential, cold junction temperature, and heat sink temperature, respectively.

The results for a system $\Delta T=150°$ C. and average material quality of $\bar{Z}=3$ is shown in FIG. 9. The constant property system shows a gradual improvement with a minimum of four stages required. When the stages have segmented couples with a $\Delta S/\bar{S}=0.25$ for each stage, a three stage system can be used. If the constant property device is designed with six stages to get higher efficiency, segmenting will give the same COP with four stages ($\Delta S/\overline{S}=0.25$) or with three stages with ($\Delta S/\overline{S}=0.50$). The comparison over most of the design range shows COP improvements which are easily a factor of two.

In referring to the known segmented thermoelements used in Seebeck power generators, it was pointed out that the subject invention is distinguishable therefrom in the particular relationship between the values of S for each segment and the position of the segment with respect to the hot and cold junctions. For conventional thermoelectric materials, the optimum range for $\sigma$ would be about 800–1200 (ohm-cm.)$^{-1}$. If one were to follow the teachings of the prior art, such as U.S. Pat. 3,051,767 discussed above, to optimize within the operating temperature range, one would be compelled to select a material having a $\sigma$ value of about 400–500 (ohm-cm.)$^{-1}$ for the segment adjacent the cold junction. Then the effective $\sigma$, when the temperature was dropped to 210–240° K. in operation, would increase to about 800–1000 (ohm-cm.)$^{-1}$. Compare this teaching with the P-type element of Example I where the $\sigma$ at the cold junction is 1609 (ohm-cm.)$^{-1}$ and the $\sigma$ at the hot junction is 405 (ohm-cm.)$^{-1}$. Under operating conditions the effective value of $\sigma_{P,1}$ would be well over 2000 (ohm-cm.)$^{-1}$ which is directly contrary to all known prior art teachings.

It should be stressed that the particular thermoelectric materials used in the fabrication of a segmented or continuous thermoelectric arm in accordance with the principles of the invention may be selected from a wide variety of presently known semiconductors. Some typical semiconductor or thermoelectric matrix materials which can be used in this invention include combinations of silver-seleniums,
silver-antimony-telluriums,
silver-antimony-seleniums,
silver-antimony-tellurium-seleniums,
bismuth-selenium-telluriums,
bismuth-antimony-selenium and tellurium materials,
bismuth-tellurium sulfides,
sodium-manganese-tellurium and selenium materials,
manganese-tellurium-arsenides,
lead-tellurium and selenium materials,
indium-antimony materials,
germanium-tellurium and selenium materials,
indium-arsenides,
indium-arsenide-phosphides,
transition metal oxides such as nickel oxide,
manganese oxide,
zinc oxide and others,
copper oxide,
zinc-antimony materials,
manganese-silicons,
chromium-silicons,
gallium-phosphorus,
gallium-arsenides,
manganese-tin materials,
rare earths sulfides (e.g., cerium sulfide and gadolinium sulfide),
gadolinium-selenides and tellurides,
tantalum-telluriums,
columbium-tantalum-tellurium and selenium materials,
silver-antimony-sulfides,
copper-gallium-telluriums,
copper-zinc-arsenides,
nickel-zinc-antimonides,
silver-arsenic-seleniums,
silver-chromium-telluriums,
silver-iron-telluriums,
silver-cobalt-telluriums,
silver-indium-telluriums,
boron-doped carbons,
silicon-doped carbons,
doped boron carbides,
doped-borons,
hafnium-silicons and variations of all the above matrices doped with nonstoichiometric portions of various elements such as carbon, titanium, zirconium, beryllium, copper, iron, cobalt, nickel, lithium, germanium, silicon, selenium, tellurium, chromium and others. The principal criterion on which the materials are selected for a segmented thermoelement is that the relative values of S must provide an explicit ΔS in the manner described herein. In designing a thermoelement for a particular application, the materials would be normally selected such that the average Z for the material within the operating temperature range is relatively high as compared to other available materials, so long as the ΔS conditions are satisfied.

In line with the above, another point which further illustrates the versatility of the present invention is the fact that segmented or continuous gradient elements can be used to improve the efficiency of heat pumping within any temperature range which could reasonably be expected in actual practice. Whereas, the materials used in segmented thermoelectric generators have been selected on the basis of a high average Z within the operating temperature range, the materials selected for use in the subject heat pumping applications may also be selected on the basis of relatively high Z, but principally on the basis of the S value relationship. The important distinction is the fact that segmenting, and other means of producing an explicit S variation, can augment the efficiency and performance of thermoelements in *any* heat pumping application. Accordingly, Z is no longer the absolute controlling parameter for optimum of performance in a Peltier thermoelectric couple.

Various theoretical studies have been made on the effect of nonhomogeneous thermoelements, e.g. Journal of Applied Physics, (volume 32, No. 8) August 1961, pp. 1584–1589, A. H. Boerdijk; but the present invention represents the first practical application of this theory to a useable, commercially feasible device.

While this invention has been described in connection with certain specific embodiments thereof, it is to be understood that this is by way of illustration and not by way of limitation; and the scope of the appended claims should be construed as broadly as the prior art will permit.

What is claimed is:

1. In a Peltier thermoelectric couple which includes a P-type thermoelectric element, an N-type thermoelectric element, and an electrical conductor joining said elements in series such that when unidirectional electrical energy is supplied thereto, a hot junction is produced at one end of each of said elements and a cold junction is produced at the opposite end of each of said elements, the improvement wherein at least one of said thermoelectric elements is formed of thermoelectric material having differing thermoelectric properties along the spatial extent thereof between said hot junction and said cold junction, the absolute value of the Seebeck coefficient of said material at said cold junction being significantly less than the absolute value of the Seebeck coefficient of material at said hot junction.

2. A couple as defined in claim 1 wherein said thermoelectric elements are formed of discrete segments of thermoelectric material having different thermoelecrtic properties, said sections being bonded with an electrically conductive material.

3. A couple as defined in claim 1 wherein said thermoelectric elements are formed with a continuous gradient of varying thermoelectric porperties.

4. A thermoelectric couple comprising a P-type thermoelectric element and an N-type thermoelectric element electrically connected by means of a conductor, a source of undirectional electrical energy coupled in series with said thermoelectric elements and said conductor such that a cold junction is formed at one end of said thermoelectric elements and a hot junction is formed at the opposite ends of said thermoelectric elements, each of said elements comprising a plurality of discrete segments bonded together to form a nonhomogeneous element, the absolute value of the Seebeck coefficient of material adjacent said cold junction being significantly less than the absolute value of the Seebeck coefficient of material at said hot junction.

5. A thermoelectric couple comprising a P-type thermoelectric element and an N-type thermoelectric element electrically connected by means of a conductor, a source of unidirectional electrical energy coupled in series with said thermoelectric elements and said conductor such that a cold junction is formed at one end of said thermoelectric elements and a hot junction is formed at the opposite ends of said thermoelectric elements, each of said elements being formed of material having a continuous Seebeck coefficient gradient from said hot junction to said cold junction, the absolute value of the Seebeck coefficient of material adjacent said cold junction being significantly less than the absolute value of the Seebeck coefficient of material at said hot junction.

References Cited

UNITED STATES PATENTS

| | | | |
|---|---|---|---|
| 3,343,373 | 9/1967 | Henderson et al. | 62—3 |
| 3,391,030 | 7/1968 | Beaver, Jr. et al. | 136—203 |
| 3,051,767 | 8/1962 | Fredrick et al. | 136—205X |
| 3,208,835 | 9/1965 | Duncan et al. | 136—237 |
| 3,296,033 | 1/1967 | Scuro et al. | 136—205 |

FOREIGN PATENTS

| | | | |
|---|---|---|---|
| 687,900 | 6/1964 | Canada | 136—205 |

ALLEN B. CURTIS, Primary Examiner

U.S. Cl. X.R.

136—205